United States Patent [19]

Kohno

[11] Patent Number: 5,662,742

[45] Date of Patent: Sep. 2, 1997

[54] EQUIPMENT FOR MANUFACTURING A SEMICONDUCTOR DEVICE USING A SOLID SOURCE

[75] Inventor: Hiroshi Kohno, Tokyo, Japan

[73] Assignee: NEC Corporation, Tokyo, Japan

[21] Appl. No.: 723,985

[22] Filed: Sep. 27, 1996

[30] Foreign Application Priority Data

Oct. 26, 1995 [JP] Japan ..................... 7-278679

[51] Int. Cl.$^6$ ................................. C23C 14/00
[52] U.S. Cl. ................................. 118/726
[58] Field of Search ............................. 118/726

[56] References Cited

U.S. PATENT DOCUMENTS 4,548,670  10/1985  Pinkhasov .
5,041,302   8/1991  Koide .

FOREIGN PATENT DOCUMENTS 0 039 751  11/1981  European Pat. Off. .
2-51489     2/1990  Japan .

OTHER PUBLICATIONS

G. Peter et al., "A new electron beam evaporation source for Si molecular beam epitaxy controlled by a quadrupole mass spectrometer", Journal of Vacuum Science & Technology, Nov./Dec. 1991, vol. 9, No. 6, New York, pp. 3061–3063.

"Pb/Sn Thickiness Monitor", IBM Technical Disclosure Bulletin, Mar. 1985, vol. 27, No. 10A, pp. 5542–5543.

*Primary Examiner*—Richard Bueker
*Attorney, Agent, or Firm*—Young & Thompson

[57] ABSTRACT

In an Si-MBE equipment, a vapor deposition equipment or the like, electrodes for measuring solid source resistance are disposed on both sides of the solid source, thereby being capable of monitoring the source resistance from the exterior of the equipment using those electrodes. In this situation, the resistance corresponding to the limit of the amount of its use is found in advance, thereby knowing timing of exchanging the solid source and also of previously preventing the hearth from being damaged due to unexchange of the source.

5 Claims, 4 Drawing Sheets

EQUIPMENT FOR MANUFACTURING A SEMICONDUCTOR DEVICE USING A SOLID SOURCE

BACKGROUND OF THE INVENTION

1. Field of the Invention

The present invention relates to an equipment for manufacturing a semiconductor device using a solid source such as a silicon molecular beam epitaxy equipment (hereinafter referred to as "Si-MBE") or a vapor deposition equipment.

2. Description of the Related Art

A conventional solid source Si-MBE is structured as shown in FIG. 1. In the figure, reference numeral 1 denotes a Si solid source; 2, a copper hearth; 7, a growth chamber; 8, a wafer exchange chamber; 9, a wafer rotary heating mechanism; 10, a liquid nitrogen shroud for cooling the device; 11, a wafer; 12, a port with an impurity vapor deposition source cell; and 13, a crucible for the impurity vapor deposition source cell. Si crystal growth was conducted by putting the wafer 11 on the wafer rotary heating mechanism 9 in such a manner that a surface of the wafer 11 from which crystal grows is directed downward, and melting the Si solid source 1 by electron beams irradiated from an E-GUN filament (not shown) within the solid source copper hearth 2 which is located centrally at the lower side of the growing chamber 7 to evaporate the melted solid source 1 as molecular beams. Also, impurity doping is conducted by evaporating impurities inserted into the crucible 13 for the impurity vapor deposition source cell simultaneously during the Si growth.

The conventional Si solid source 1 is inserted into the exclusive copper hearth 2 having a hole defined in the upper portion thereof where the solid source is located, and the amount of decrease of the Si solid source has been recognized from a view port provided in the growing chamber by operator's eyes. The procedure will be described with reference to the structural cross-sectional view of the hearth as follows.

FIG. 2A shows a structural cross-sectional view showing the solid source copper hearth for use in the conventional solid source Si-MBE or vapor deposition equipment. In the figure, reference numeral 3 denotes an E-GUN filament, and 4 is a deflecting lens. The electron beams outputted from the E-GUN filament 3 are irradiated onto the upper surface of the solid source 1 through the deflecting lens 4 so as to melt and evaporate a part of the Si source. Hence, as the source is consumed, the source surface becomes hollow as shown in FIG. 2B. A change in the hollow shape of the source surface is recognized mainly by eye to determine timing of exchanging the source.

However, in the conventional technique, it was difficult to recognize an actual condition depthwise of the source surface because its normal work cannot be performed under the atmosphere in an ultra high vacuum equipment. Also, there is a case in which there is the vapor deposition source at a position which is difficult to recognize from the view port defined in the growth chamber. In this case, unless the use limit is grasped, the Si source 1 disappears at the electron beams irradiating portion as shown in FIG. 3. As a result, the electron beams from the E-GUN filament 3 are directly irradiated onto the bottom portion of the copper hearth 2, whereby Cu atoms of the hearth material instead of Si spread over the growing chamber as molecular beams, resulting in the possibility that the device is contaminated by heavy metal. The contamination due to the heavy metal induces an epitaxial crystal defect and dislocation, and the crystal defect and dislocation allow such a characteristic deterioration as an increase in leak current during manufacturing the device. Moreover, with the continuation of this state, there is a case in which not only the device is contaminated by Cu but also the bottom portion of the hearth is damaged.

In view of the above, up to now, timing of exchanging the vacuum deposition source was set by controlling the total amount of use of the solid source using a film thickness integrating meter, or timing of exchanging the vacuum deposition source was recognized by eye. However, these methods were improper as a mass production equipment because they largely depended on experience of a worker.

Also, to solve the above problem, there has been attempted a proposal in which an X-ray source and an X-ray receiving portion are fixed, respectively, onto both sides of a fixing port of a cell into which a vapor deposition source is inserted, to manage a remaining amount of the vapor deposition source as an X-ray transmission image (Japanese Patent Unexamined Publication No. Hei 2-51489).

However, that proposal requires that the vapor deposition source is inserted into the cell, and also that there arise, because an X-ray source 15 and an X-ray receiving portion 16 are required for each cell, a problem relating to a safety management from the viewpoint of the property of X-rays, and a problem relating to an increase of the management costs caused by the safety management, and so on. Therefore, the proposal is improper for a mass production equipment to be dealt with by a large number of unspecified workers. Furthermore, the hearth for the Si solid source normally used in the Si-MBE is located in the center of a growth chamber which is kept in an ultra high vacuum state, and the outer configuration of the Si solid source is not changed even though the X-ray transmission image is observed from the exterior of the equipment. As a result, it was difficult to regognize the accurate remaining amount.

SUMMARY OF THE INVENTION

The present invention has been made in view of the above, and an object of the present invention is to provide a device for manufacturing a semiconductor using a solid source such as an Si-MBE or a physical vapor deposition equipment, which is capable of readily and accurately recognizing and measuring the remaining amount of the solid source from the exterior of the equipment.

Since the remaining amount of the solid source can be recognized and measured, appropriate timing of exchanging the solid source can be known, thereby being capable of reducing an excessive atmospheric release, and also being capable of preventing the interior of the device from being contaminated and the bottom of the hearth from being damaged because the solid source is lost.

In other words, there is provided resistance measuring means for measuring the resistance of the solid source from the exterior of the device, thereby being capable of recognizing the remaining amount of the solid source.

Specifically, there are two electrodes which are brought in close contact with the solid source in such a manner that they are separated from each other through the solid source. As the solid source is reduced, the resistance between those two electrodes which are in close contact with the remaining solid source is also changed. If a relation between the resistance and the remaining amount of the solid source is plotted in advance, and the resistance is measured from the exterior of the device, the remaining amount of the solid source can be found.

Those two electrodes which are brought in close contact with the solid source are brought in close contact with the side surfaces of the solid source. The two electrodes are brought in close contact with the solid source, respectively, in such a manner that they are separated from each other so as to be out of contact with each other, and they are separated from other electric conductors such as the hearth so as to be out of the latter.

In other words, according to the present invention, there is provided a device for manufacturing a semiconductor having a solid source that generates molecular beams or atomic beams from the upper surface, therein, characterized in that there is provided means for measuring a resistance of the solid source.

The means for measuring the resistance of the solid source includes a first electrode which is in close contact with the solid source and a second electrode which is separated from the first electrode and in close contact with the solid source.

It is preferable that the first and second electrodes and the solid source are received in an insulator.

It is preferable that the first electrode is disposed on a side surface of the solid source, and the second electrode is disposed on another side surface of the solid source which is opposite to the first electrode, or the first electrode is disposed on an upper portion of the side surface of the solid source, and the second electrode is disposed on a lower portion of the side surface of the solid source.

BRIEF DESCRIPTION OF THE DRAWINGS

The above-mentioned and other objects, features, and advantages of the present invention will become more apparent from the following detailed description when taken in conjunction with the accompanying drawings, wherein.

DETAILED DESCRIPTION OF THE PREFERRED EMBODIMENTS

Now, a description will be given in more detail of preferred embodiments of the present invention with reference to the accompanying drawings.

Figure 1:
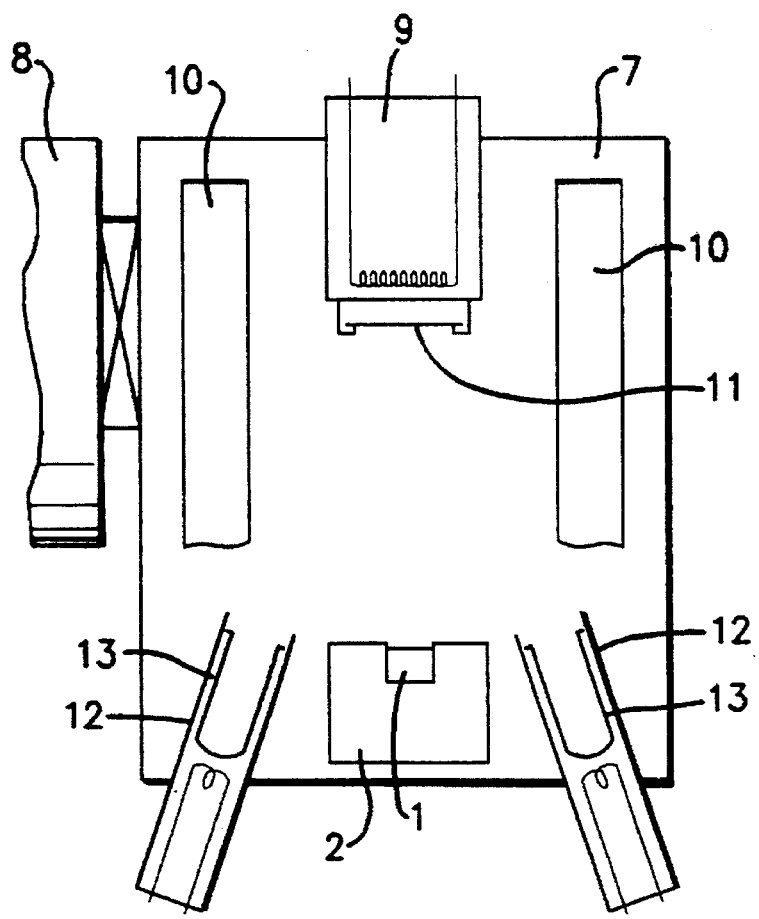
FIG. 1 is a schematic diagram showing a conventional solid source Si-MBE equipment.
Figure 4:
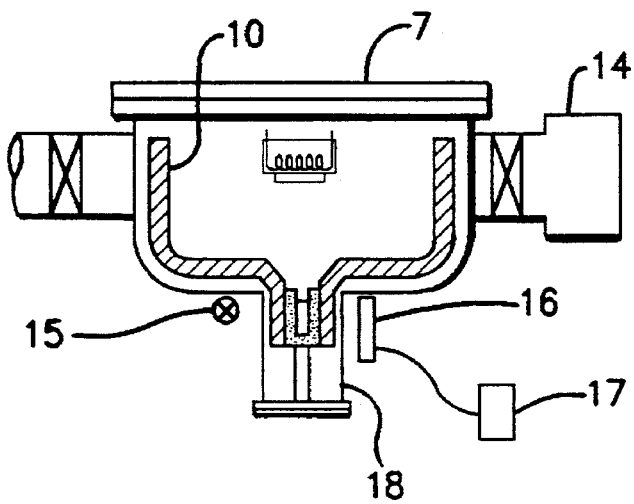
FIG. 4 is a structural cross-sectional view showing a conventional Si-MBE equipment which is capable of measuring the remaining amount of the solid source.
Figure 2A:
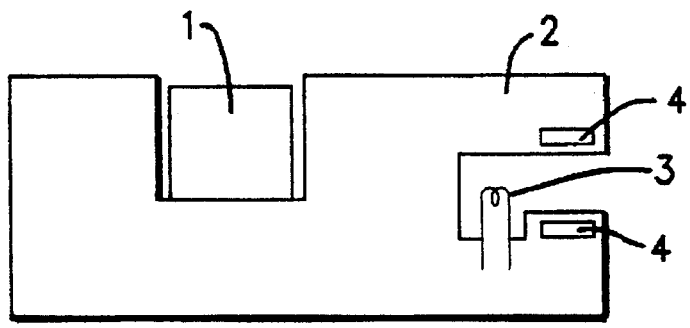
FIG. 2A is a structural cross-sectional view showing a conventional solid source hearth.
Figure 2B:
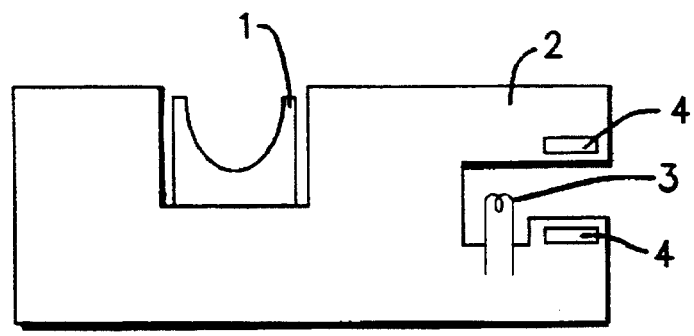
FIG. 2B is a structural cross-sectional view showing the conventional solid source hearth when the source is consumed.
Figure 3:
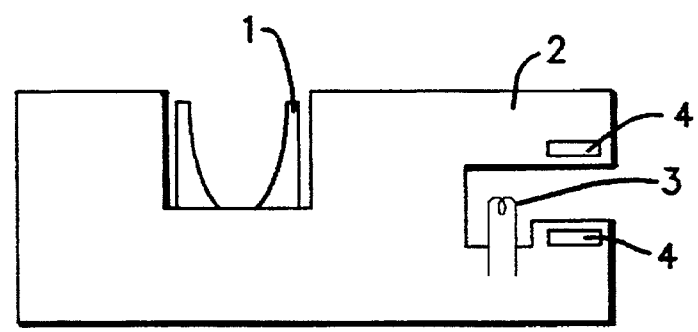
FIG. 3 is a structural cross-sectional view showing the conventional hearth into which a solid source that exceeds a use limit is inserted.
Figure 5:
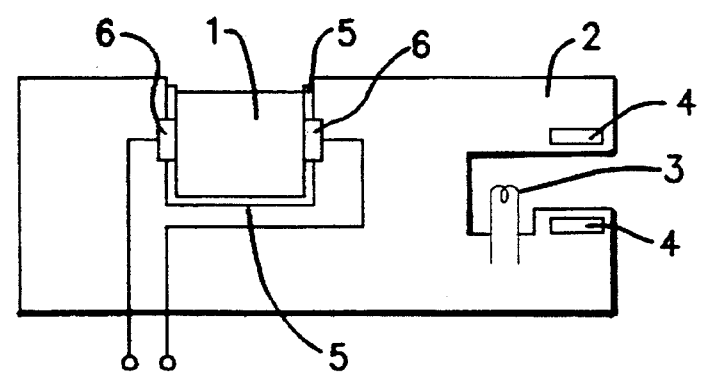
FIG. 5 is a structural cross-sectional view showing a solid source hearth in accordance with a first embodiment of the present invention.
Figure 6:
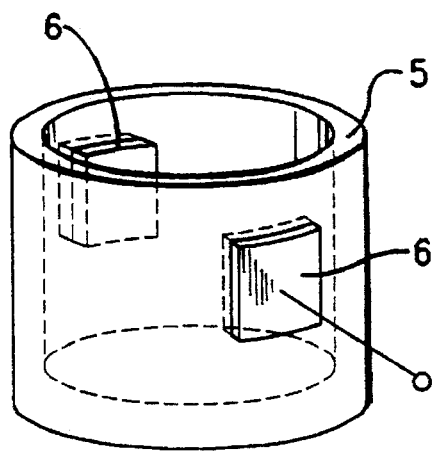
FIG. 6 is a perspective view showing a source insertion portion of the solid source hearth in the first embodiment of the present invention.

FIG. 5 is a structural cross-sectional view showing a solid source copper hearth for description of a first embodiment of the present invention. FIG. 6 is an enlarged perspective view showing only a source insertion portion of the solid source copper hearth shown in FIG. 5.

A insulator (ex. ceramics) 5 which is cylindrical and has an electrode opening portion is located on a copper hearth 2. Two electrodes 6 for measuring a source resistance are fixed to the electrode opening portion. The electrodes 6 for measuring the source resistance are wired up to the exterior of the device so that a resistance can be monitored at the exterior of the device. Although not shown, there is required a equipment that draws out wires from the electrodes 6 for measuring the source resistance so as to monitor the resistance at the exterior of the device. The electrodes 6 for measuring the source resistance is of the movable type and always adjusted in such a manner that the insides of the respective electrodes are in close contact with the outer surface of the source.

Figure 7:
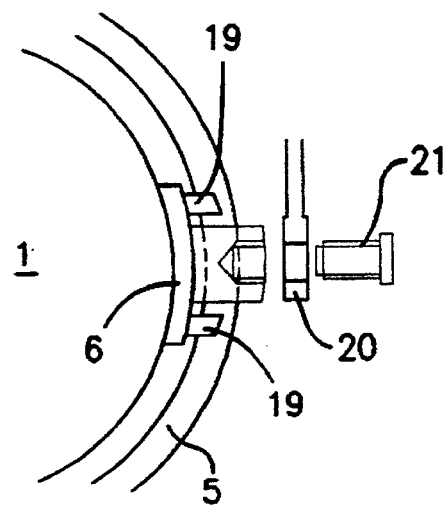
FIG. 7 is a partially enlarged diagram showing an electrode for measurement of source resistance in the first embodiment of the present invention.

FIG. 7 is an enlarged diagram showing the vicinity of the electrodes 6 for measuring the source resistance. An externally draw-out crimp-style terminal 20 and the electrode 6 for measuring the source resistance are fixed to each other through a screw 21. Coil springs 19 which are disposed between the electrode 6 for measuring the source resistance and the ceramic insulator 5 bring the electrode 6 in close contact with the outer surface of the source.

The ceramic insulator 5 is so provided as not to measure the resistance of the hearth per se when measuring the resistance. The ceramic insulator 5 may be made of any material if it is an insulating chamber with a heat resistance, for example, made of pyrotech boron nitride (PBN) or the like.

A method of using the solid source within the device is that electron beams discharged from an E-GUN filament 3 within the copper hearth 2 is deflected by a deflecting lens 4 and then irradiated onto an Si source 1, as in the conventional methods. The deflecting lens 4 allows a magnetic field to be applied by a deflection operating electromagnet so as to deflect the electron beams.

The Si source 1 as used is a monocrystal 3 to 15 $\Omega$cm in resistance and 40 to 70 mm×30 mm. Normally, because molecular beams that evaporated from the Si source 1 is neutral, an influence of an electric field on the molecular beams can be ignored even though the electric field is applied by the electrodes 6 for measuring the source resistance. Also, in the case of evaporated ions, ions can be further increased in number with the application of the electric field. It is needless to say that the solid source is not limited by or to Si but applicable to any kind of the solid source. Moreover, similarly, the device for manufacturing the semiconductor device using the solid source is not limited by or to MBE but applicable to equipments for manufacturing semiconductor devices using other solid sources.

It has been found through the measurement of the source resistance conducted before epitaxial growth that the measured resistance is increased in accordance with a reduction in the amount of the source. The ratio of the increase in the source resistance depends on the size of the source as used as well as the designed resistance of the source. However, if the correlation curve of the source resistance with respect to the use amount is monitored in advance, the use limit amount can be found from the curve as far as a source of the same regulation is used, and therefore even an unexperienced worker can grasp a timing of exchanging the source.

Also, a damage of the hearth due to unexchange of the source can be previously prevented.

Figure 8:
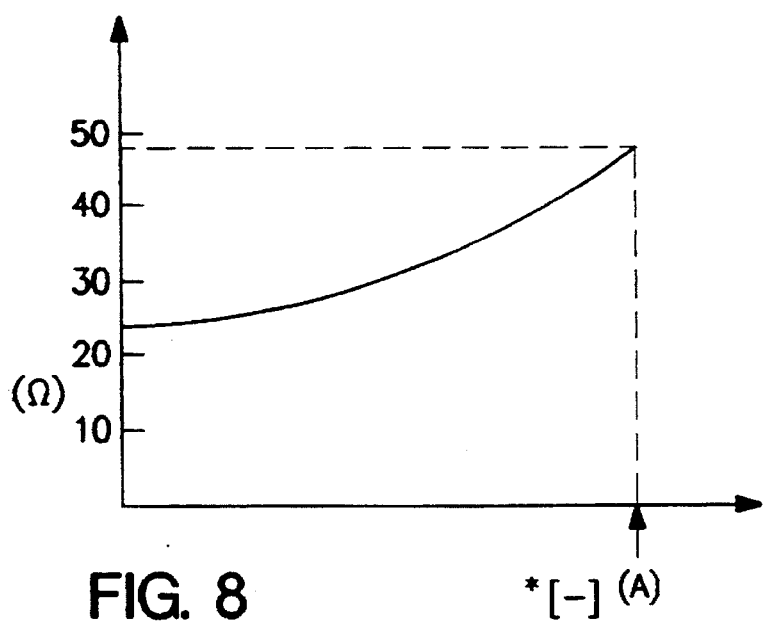
FIG. 8 is a diagram showing a specific example of a resistance fluctuation curve with respect to a use amount.

FIG. 8 is a diagram showing a specific example of resistance fluctuation curve with respect to a use amount. In the figure, a resistance before use was 24Ω, but the resistance is increased as the source use amount is increased in such a manner that it became 48Ωwhen the source use amount reached a use limit amount (A). Therefore, it is understandable that an succeeding exchange of the source is conducted when the source resistance becomes 48Ω. In FIG. 8, a horizontal axis represents the source use amount, but may change in accordance with a use purpose such as a total thickness of a grown film, the number of times of growths, date of growth, or the like.

When exchanging the source, a shift of a distance between the respective electrodes can be prevented because the source is fixedly inserted into the insulator. Also, a position at which each of the electrodes is fitted is determined in advance, and the dimensions are measured every time the source is exchanged, or an initial resistance is measured so that the distance between the respective electrodes can be determined.

Subsequently, a description will be given of a second embodiment of the present invention.

Figure 9:
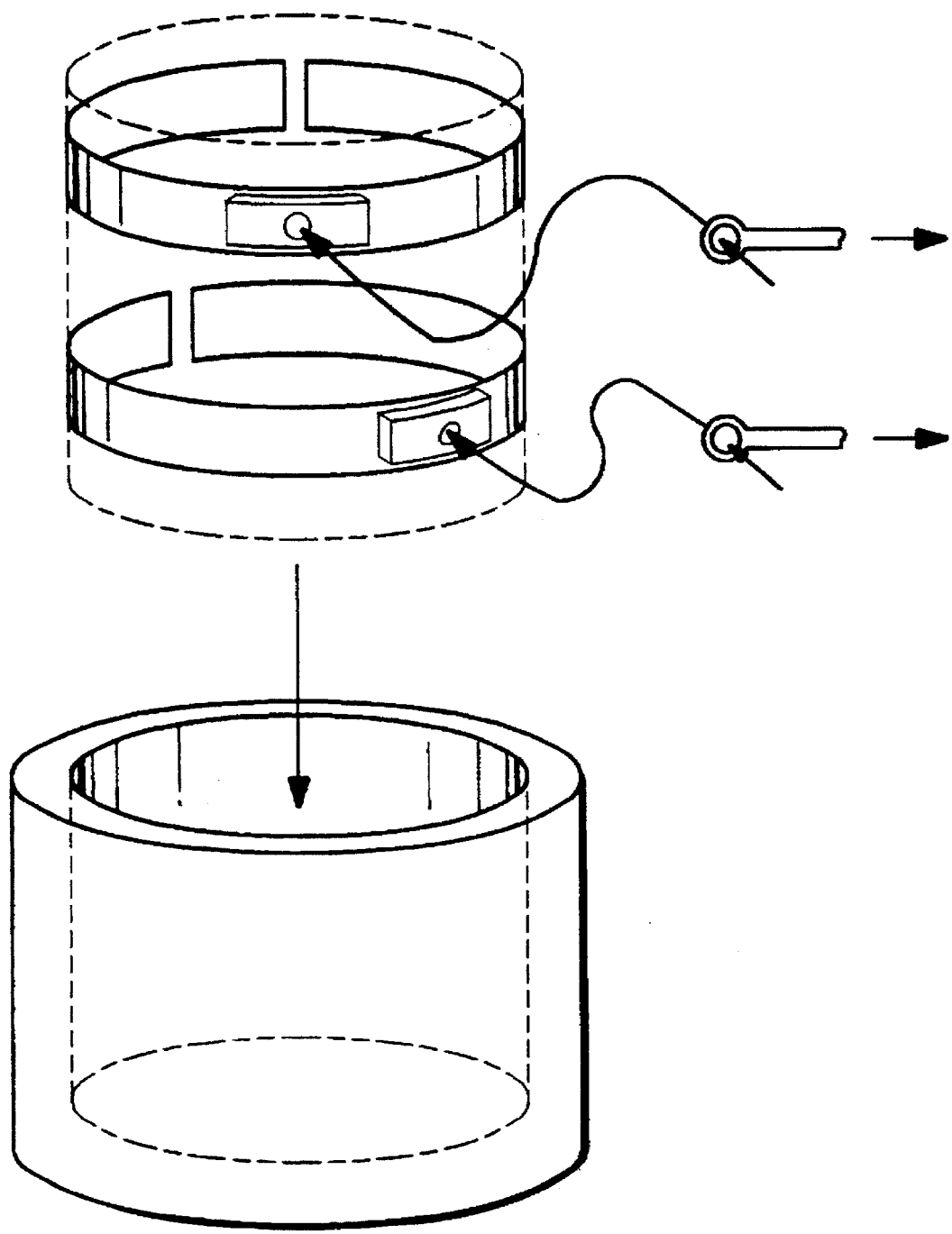
FIG. 9 is a perspective view showing a source insertion portion of the solid source hearth in a second embodiment of the present invention.

FIG. 9 is a perspective view showing only a source insertion portion of the solid source copper hearth in a second embodiment of the present invention. In the figure, electrodes 61 for measuring a source resistance is of the movable type and always adjusted so that the insides of the respective electrodes are in close contact with the outer surface of the source. In the second embodiment, because the electrodes 61 per se are available as springs, they can be brought in close contact with the outer surface of the source even though no coiled springs 19 as in the first embodiment is used. Also, the ceramic insulator 51 is so provided as not to measure the resistance of the hearth per se when measuring the resistance of the solid source. Similarly, in the second embodiment, although not described, there is required in addition to the above-mentioned elements a device that draws out wires from the electrodes 61 for measuring the source resistance so as to monitor the resistance at the exterior of the device.

With an increase in areas of the electrodes for measuring the resistance in the above manner, the ratio of a change in resistance which is caused by a change in the shape of the source becomes remarkable, thereby being capable of grasping a timing at which the source reaches the limit of its use.

It should be noted that in the above embodiment, there is shown the MBE using the Si source, but it is needless to say that it is available to other solid sources. Moreover, it may be used in any devices that use the solid sources in the vacuum devices such as a vapor deposition equipment other than the MBE.

As was described above in more detail, according to the present invention, in the hearth used in an equipment using a solid source such as an Si-MBE device or a vapor deposition device, the source resistance measuring portions are disposed on the sides of the source insertion portion, and the hearth by which the resistance can be recognized from the exterior of the device is used, thereby being capable of grasping a timing of exchanging the source and of previously preventing the hearth from being damaged by using the source that exceeds the limit of its use.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An equipment for manufacturing a semiconductor device, comprising:
   a solid source that generates one of molecular beams and atomic beams from an upper surface thereof; and
   means for measuring resistance of said solid source.

2. An equipment for manufacturing a semiconductor device as claimed in claim 1, wherein said means for measuring resistance of said solid source comprises a first electrode which is in close contact with said solid source and a second electrode which is separated from said first electrode and in close contact with said solid source.

3. An equipment for manufacturing a semiconductor device as claimed in claim 2, further comprising an insulator for receiving said first and second electrodes and the solid source therein.

4. An equipment for manufacturing a semiconductor device as claimed in claim 2, wherein said first electrode is disposed on a side surface of said solid source, and said second electrode is disposed on another side surface of said solid source which is opposite to said first electrode.

5. An equipment for manufacturing a semiconductor device as claimed in claim 2, wherein said first electrode is disposed on an upper portion of the side surface of said solid source, and said second electrode is disposed on a lower portion of the side surface of said solid source.

* * * * *